United States Patent
Mahler et al.

(10) Patent No.: US 7,705,441 B2
(45) Date of Patent: Apr. 27, 2010

(54) SEMICONDUCTOR MODULE

(75) Inventors: Joachim Mahler, Regensburg (DE);
Reimund Engl, Regensburg (DE);
Thomas Behrens, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 11/682,353

(22) Filed: Mar. 6, 2007

(65) Prior Publication Data

US 2008/0220564 A1 Sep. 11, 2008

(51) Int. Cl.
*H01L 23/31* (2006.01)
*H01L 23/02* (2006.01)
*H01L 21/00* (2006.01)

(52) U.S. Cl. .............. 257/686; 257/723; 257/754; 257/789; 257/795; 257/E23.131; 438/109

(58) Field of Classification Search ........... 257/723, 257/724, 725, 686, 789, 795, E23.131; 438/109
See application file for complete search history.

(56) References Cited

U.S. PATENT DOCUMENTS

| 6,291,264 | B1 * | 9/2001 | Tang et al. ............ 438/106 |
| 6,646,347 | B2 | 11/2003 | Sarihan et al. |
| 6,756,689 | B2 | 6/2004 | Nam et al. |
| 6,835,598 | B2 | 12/2004 | Baek et al. |
| 7,245,013 | B2 * | 7/2007 | Reiss et al. ............ 257/738 |
| 2002/0140107 | A1 * | 10/2002 | Kato et al. ............ 257/777 |
| 2003/0111716 | A1 * | 6/2003 | Ano ............ 257/678 |
| 2003/0162320 | A1 * | 8/2003 | Ikumo et al. ............ 438/106 |
| 2004/0043534 | A1 * | 3/2004 | Yamashita ............ 438/108 |
| 2004/0051170 | A1 * | 3/2004 | Kawakami et al. ............ 257/686 |
| 2005/0110128 | A1 * | 5/2005 | Ahn et al. ............ 257/686 |

FOREIGN PATENT DOCUMENTS

EP 1 501 126 1/2005

* cited by examiner

*Primary Examiner*—Ngan Ngo
*Assistant Examiner*—Benjamin Tzu-Hung Liu
(74) *Attorney, Agent, or Firm*—Dicke, Billig & Czaja, PLLC

(57) ABSTRACT

A semiconductor module is disclosed. One embodiment provides a first semiconductor chip, a second semiconductor chip and a spacer. The first semiconductor chip has a depression at a first main surface. The spacer applied to the first main surface and at least partly fills the depression. The second semiconductor chip is applied to the spacer.

40 Claims, 6 Drawing Sheets

FIG 1A
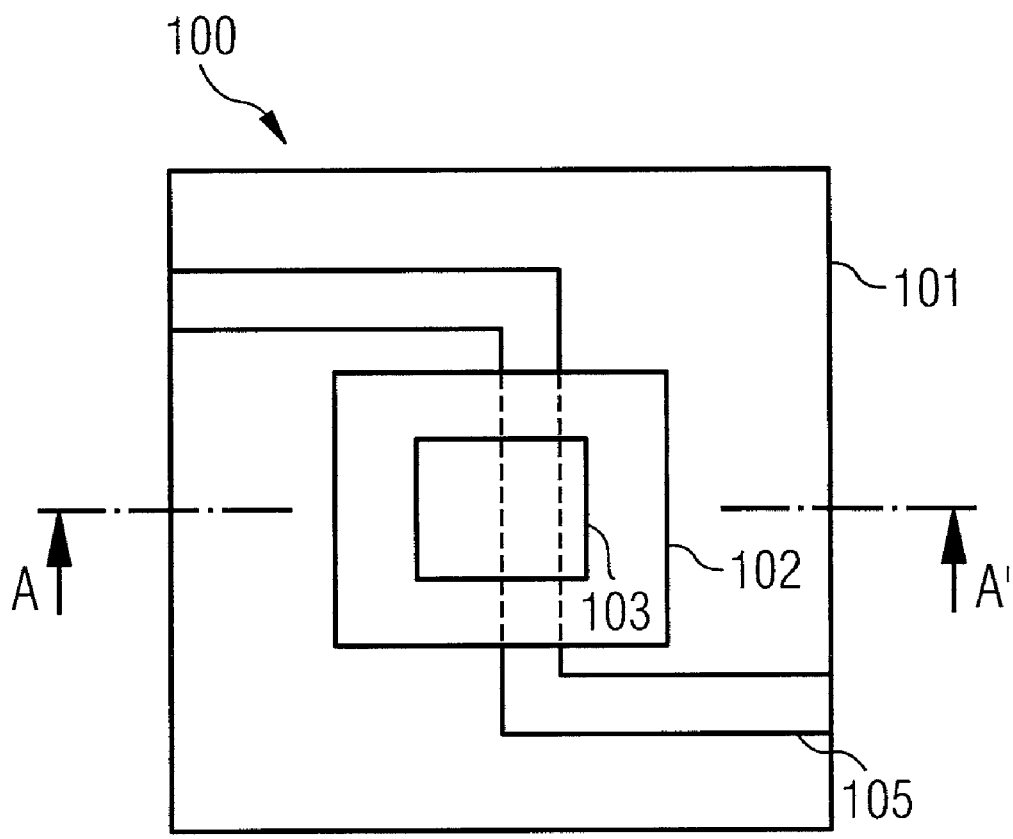
FIG 1B  A-A'
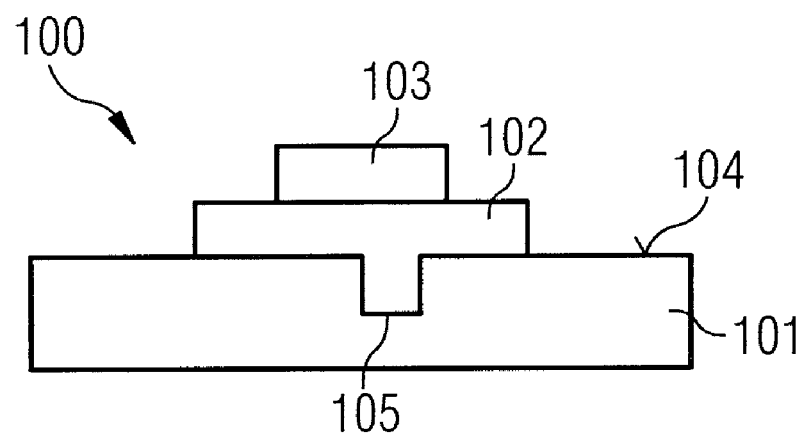

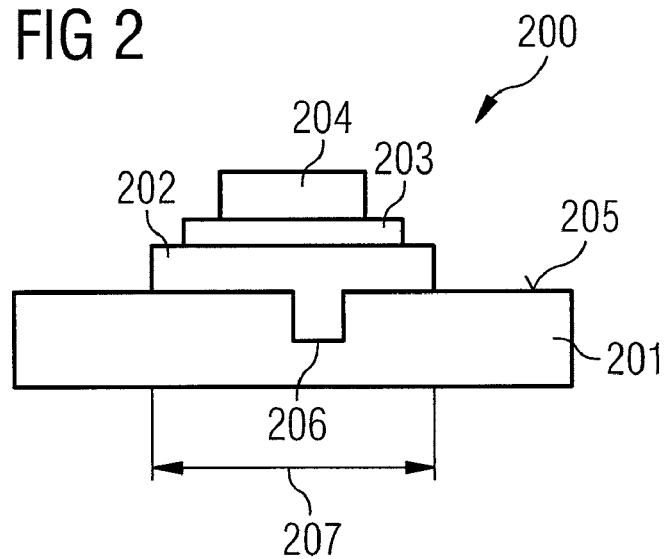
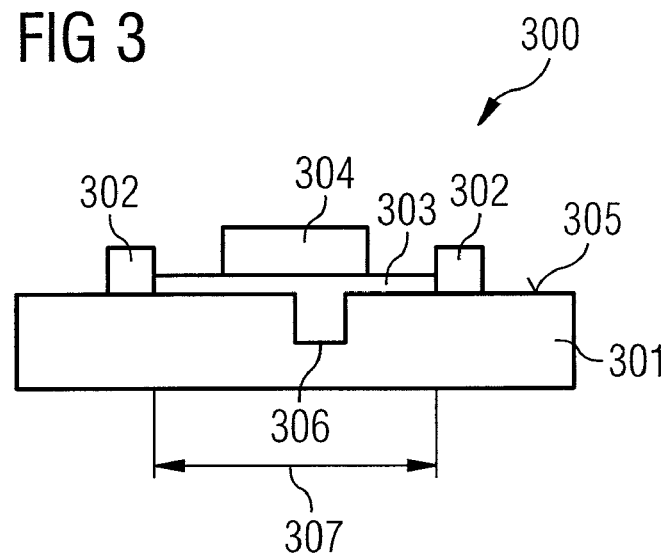
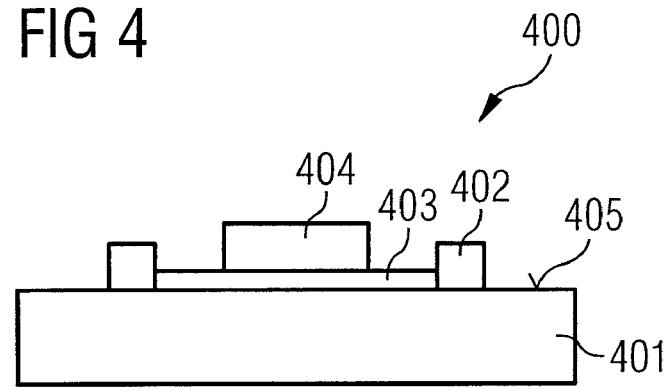

SEMICONDUCTOR MODULE

BACKGROUND

The invention relates to a semiconductor module and a method for producing a semiconductor module.

In modules containing more than one semiconductor chip, the semiconductor chips can be arranged in different ways. The semiconductor chips can for example be applied to a carrier one alongside another or be stacked one above another. A high packing density is achieved by the stacking of the semiconductor chips.

SUMMARY

In accordance with one embodiment, a module includes a first semiconductor chip, a second semiconductor chip and a spacer. The first semiconductor chip has a depression at a first main surface. The spacer is applied to the first main surface and at least partly fills the depression. The second semiconductor chip is applied to the spacer.

In accordance with a further embodiment, a module includes a first semiconductor chip, a second semiconductor chip, a delimiting structure and an adhesive material. The first semiconductor chip has a depression at a first main surface. The delimiting structure delimits a first region of the first main surface. The adhesive material is applied to the first region. The second semiconductor chip is applied to the adhesive material.

In accordance with a further embodiment, a module includes a first semiconductor chip, a second semiconductor chip, a barrier structure and an adhesive material. The barrier structure is applied to a first main surface of the first semiconductor chip. The adhesive material is likewise applied to the first main surface and is delimited in its extent by the barrier structure. The second semiconductor chip is applied to the adhesive material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A and 1B illustrate a schematic illustration of a module 100 in a cross-sectional view and a plan view;

FIG. 2 illustrates a schematic illustration of a module 200;

FIG. 3 illustrates a schematic illustration of a module 300;

FIG. 4 illustrates a schematic illustration of a module 400;

DETAILED DESCRIPTION

Figure 5:
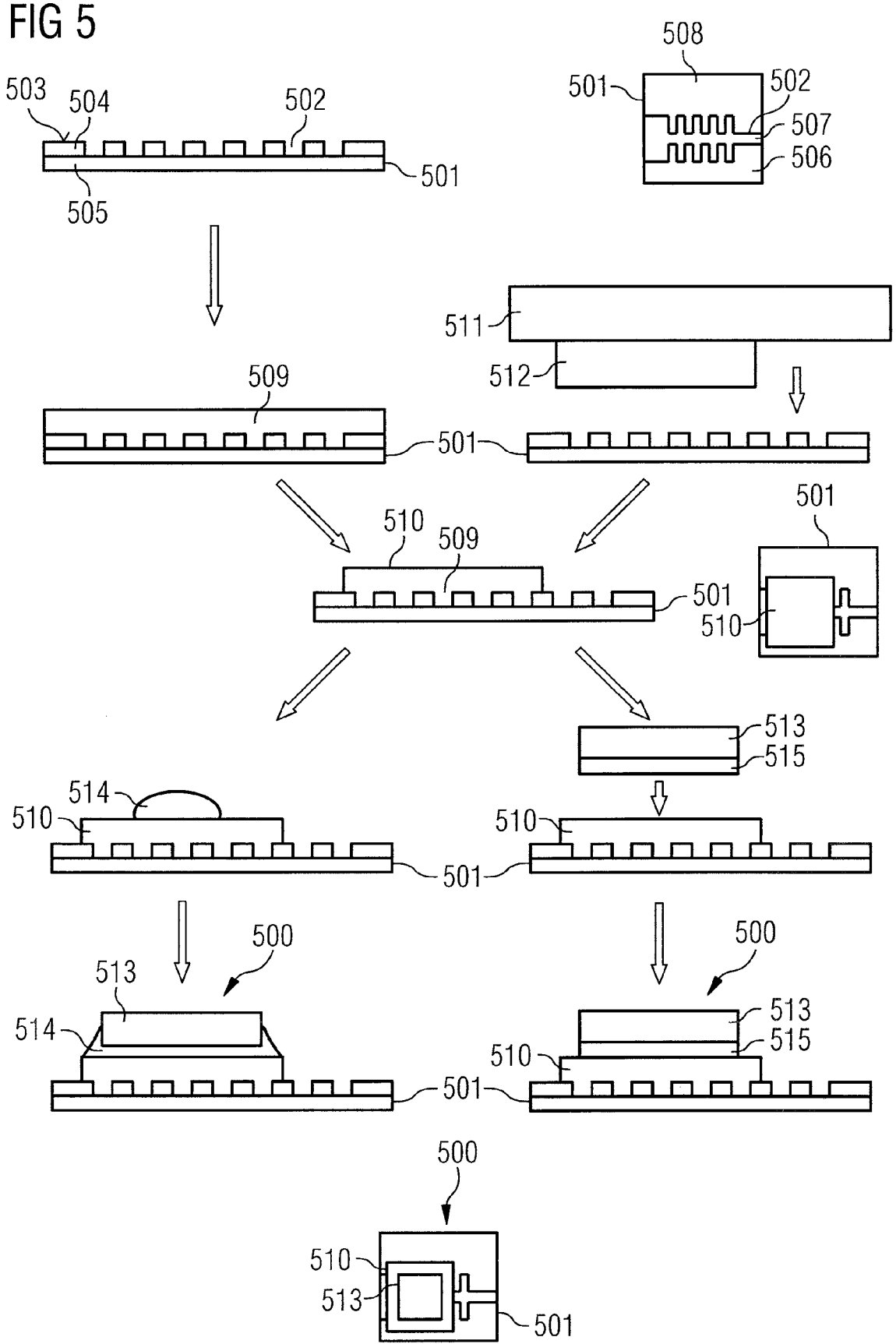
FIG. 5 illustrates schematic illustrations of a module 500 and of a method for producing the module 500.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Modules containing semiconductor chips are described below. The specific embodiments of the semiconductor chips are not of importance here. The semiconductor chips may be for example integrated circuits of any desired form, microprocessors, power semiconductors, logic devices or microelectromechanical components. The semiconductor chips do not have to be fabricated from any specific semiconductor material; they may additionally also contain non-semiconducting inorganic and/or organic materials. Furthermore, the semiconductor chips may be present in packaged or unpackaged form.

Some of the semiconductor chips described below have one or more depressions on one of their main surfaces. The depressions may for example in each case extend from one lateral edge of the semiconductor chip as far as another lateral edge and thus subdivide the main surface of the semiconductor chip into a plurality of regions that are separated from one another by the depressions. The depressions need not necessarily run in rectilinear fashion, but rather may have one or more corner points.

That main surface of the semiconductor chip which has the depressions may be produced for example from an electrically conductive material, such as e.g., a metal. The main surface may be patterned by the depressions and subdivided into regions that are insulated from one another.

The modules described below may contain spacers, delimiting structures and barrier structures. The structures may be produced for example from resists, adhesive materials or adhesive films. Photolithographic processes or printing techniques, such as e.g., stencil printing or pad printing, may be used for producing the resist structures. For the photolithographic processes, for example polybenzoxazole, polyimide or epoxide, such as e.g., SU8, may be used as light-sensitive patternable resist materials. Resist structures produced by a printing technique may include e.g., filled or unfilled polyimides, epoxy resins, acrylate resins, silicone resins or mixtures of the materials mentioned. In order to produce spacers, delimiting or barrier structures composed of adhesive materials, it is possible to use e.g., filled or unfilled polyimides, epoxy resins, acrylate resins, silicone resins or mixtures of the materials mentioned. Materials from which adhesive films can be produced are for example filled or unfilled epoxy resins, polyimides, acrylate resins, silicone resins, polybenzoxazoles or mixtures thereof. Besides the materials mentioned, the spacers, delimiting and barrier structures may also be produced from other materials.

FIG. 1A illustrates a module 100 in a plan view as an exemplary embodiment. FIG. 1B illustrates the module 100 in cross section along a line A-A' depicted in FIG. 1A. The module 100 includes a first semiconductor chip 101, a spacer 102 and a second semiconductor chip 103.

A main surface 104 of the semiconductor chip 101 has a depression 105. The spacer 102 is applied to the semiconductor chip 101 and at least partly fills the depression 105. In this case, it is neither necessary for the spacer 102 to fill the depression 105 over the entire main surface 104 of the semiconductor chip 101 nor is it necessary for the depression 105 to be completely filled by the spacer 102 in the region in which the spacer 102 is applied to the semiconductor chip 101. It is conceivable, therefore, for the depression 105 not to be entirely filled with the material of the spacer 102 even in the region in which it is covered by the spacer 102. By way of example, it may happen that clearances or cavities that are not filled with the material of the spacer 102 remain in the edge region or in the lower region of the depression 105.

The spacer 102 may for example, be a resist island produced photolithographically or by a printing technique or be fabricated from an adhesive material, in particular an adhesive film.

The semiconductor chip 103 has been mounted onto the spacer 102. If the spacer 102 is electrically insulating, the semiconductor chips 101 and 103 are electrically insulated from one another by the spacer 102.

FIGS. 2 and 3 illustrate modules 200 and 300 in cross section as further exemplary embodiments. The modules 200 and 300 are in each case composed of a first semiconductor chip 201 and 301, respectively, a delimiting structure 202 and 302, respectively, an adhesive material 203 and 303, respectively, and a second semiconductor chip 204 and 304, respectively.

In the same way as the semiconductor chip 101 illustrated in FIG. 1, the semiconductor chips 201 and 301 have a depression 206 and 306, respectively, on one of their main surfaces 205 and 305, respectively. The delimiting structures 202 and 302 delimit a region 207 and 307, respectively, on the main surfaces 205 and 305. The adhesive material 203 and 303 is applied to the regions 207 and 307, respectively.

In the module 200, the delimiting structure 202 includes a spacer arranged on the main surface 205. The spacer 202 may be fabricated from a resist material photolithographically or by a printing technique or include one or more adhesive films. By using its uncovered surface, the spacer 202 demarcates the region 207 of the main surface 205 from the rest of the main surface 205. The adhesive material 203, by which the semiconductor chip 204 is fixed on the spacer 202, has been dispensed onto the spacer 202.

The spacer 202 delimits the extension possibility of the adhesive material 203 in the liquid or viscous state. Should the adhesive material 203 flow as far as the edge of the spacer 202 during the production of the module 200, the surface tension of the adhesive material 203 can prevent the latter from running down along the lateral faces of the spacer 202. Consequently, the spacer 202 delimits the propagation of the adhesive material 203 and prevents the adhesive material 203 from wetting the main surface 205.

In the module 300, the delimiting structure 302 is constructed from one or more walls. The walls 302 may be fabricated from a resist material, for example photolithographically or by a printing technique. The walls 302 may be arranged such that they completely enclose the region 307 in between them and thus separate it from the rest of the main surface 305. However, the walls 302 may also be arranged such that they extend from one lateral edge of the main surface 305 to another lateral edge and thus, although they do not completely enclose the region 307 on the main surface 305, they do separate it from the rest of the main surface 305. The adhesive material 303 is dispensed onto the region 307 during the production of the module 300, which adhesive material may also fill the depression 306, e.g., in the region 307. The walls 302 prevent the adhesive material 303 from also wetting the remaining regions of the main surface 305. The semiconductor chip 304 is fixed on the semiconductor chip 301 by using the adhesive material 303.

If the spacer 202 and the adhesive material 303 are electrically insulating, the semiconductor chips 201 and 204, and 301 and 304, are electrically insulated from one another by the spacer 202 and the adhesive material 303, respectively.

FIG. 4 illustrates a module 400 in cross section as a further exemplary embodiment. The module 400 includes a first semiconductor chip 401, a barrier structure 402, an adhesive material 403 and a second semiconductor chip 404. The barrier structure 402 and the adhesive material 403 have been applied to a main surface 405 of the semiconductor chip 401 in a corresponding manner to the walls 302 and the adhesive material 303 illustrated in FIG. 3. The semiconductor chip 404 has been fixed on the semiconductor chip 401 by using the adhesive material 403.

FIG. 5 illustrates a module 500 and a method for producing the module 500 as further exemplary embodiments. The module 500 represents a development of the modules 100 and 200 illustrated in FIGS. 1 and 2. The configurations of the module 500 that are described below may therefore equally be applied to the modules 100 and 200.

In order to produce the module 500, first a first semiconductor chip 501 is provided, which is illustrated at the top in a cross-sectional view and a plan view in FIG. 5. The semiconductor chip 501 has depressions 502 extending in part in meandering fashion over a main surface 503 of the semiconductor chip 501. The main surface 503 is formed by a metal layer 504 that has been applied to a layer 505 including silicon, for example, which layer contains the components of the semiconductor chip 501. The metal layer 504 may include for example a copper layer with a gold layer applied thereto. In particular, a layer made of a nickel-palladium alloy may be arranged between the copper layer and the gold layer. The metal layer 504 may have been produced by using one or more metallization processes. Furthermore, the metal layer 504 has been patterned, for example by using a masking process and an etching process. This has created the depressions 502 reaching down as far as the layer 505. In the present exemplary embodiment, the depressions 502 subdivide the main surface 503 into three regions 506, 507 and 508 that are not connected to one another by using the metal layer 504. Furthermore, the main surface 503 has not been coated with a passivation layer made of an insulating material, with the result that the surface of the metal layer 504 is uncovered. The depressions may e.g., have a width within the range of 15 μm to 35 μm and a depth within the range of 5 μm to 35 μm. The aspect ratio, i.e. the quotient of the depth and the width of the depressions 502, may be within the range of 0.2 to 2.2, and in particular within the range of 0.5 to 2.0, and in particular within the range of 1.0 to 2.0.

A resist layer 509 may be applied to the main surface 503, and is then patterned photolithographically. In this case, the resist layer 509 is exposed through a mask and subsequently developed. As a result of this photolithographic process, a resist island 510 filling the depressions 502 remains on the semiconductor chip 501.

As an alternative to the photolithographic process, the resist island 510 can also be printed onto the main surface 503 with the aid of printing techniques, such as e.g., stencil or pad printing. Pad printing is schematically illustrated on the right-hand side of FIG. 5, and it involves for example providing a silicone pad 511 with a resist island 512 and pressing it onto the semiconductor chip 501 at the correct location, with the result that the resist island 512 adheres to the semiconductor chip 501 and remains as resist island 510 on the semiconductor chip 501.

A second semiconductor chip 513 is mounted onto the resist island 510 with the aid of an adhesive material. This may be realized either by applying a pasty adhesive material 514 to the resist island 510 and pressing the semiconductor chip 513 onto the adhesive material 514, or by providing the semiconductor chip 513 with an adhesive film 515 at its underside and placing it by the underside onto the resist island 510. It is also conceivable, of course, for the adhesive material 514 firstly to be applied to the underside of the semiconductor chip 513 and for the semiconductor chip 513 subsequently to be applied to the resist island 510. It is likewise conceivable for the adhesive film 515 firstly to be adhesively bonded onto the resist island 510 and for the semiconductor chip 513 subsequently to be fixed on the adhesive film 515.

After the application of the semiconductor chip 513 to the pasty adhesive material 514, the module 500 may be exposed to an elevated temperature within the range of 170° C. to 250° C. for a specific time.

The module 500 is illustrated at the bottom both in cross-sectional views and in a plan view in FIG. 5. The resist island 510 prevents the adhesive materials 514 and 515 from being distributed on the semiconductor chip 501 in uncontrolled fashion, for example as a result of capillary forces. Furthermore, the resist island 510, which includes an electrically insulating material, forms a spacer that effects an electrical insulation between the two semiconductor chips 501 and 513. The adhesives 514 and 515 may likewise be produced from electrically insulating materials. Materials that can be used for the resist island 510 and the adhesives 514 and 515 have already been enumerated by way of example furtherabove.

The semiconductor chip 501 may be a power semiconductor, for example. Power semiconductors are components designed for the control and switching of currents greater than 1 A and/or voltages greater than 24 V. In particular, power diodes, thyristors, triacs, power MOSFET transistors and IGBT components are used as power semiconductors. The semiconductor chip 513 may be a logic device designed for controlling the power semiconductor 501.

Figure 6:
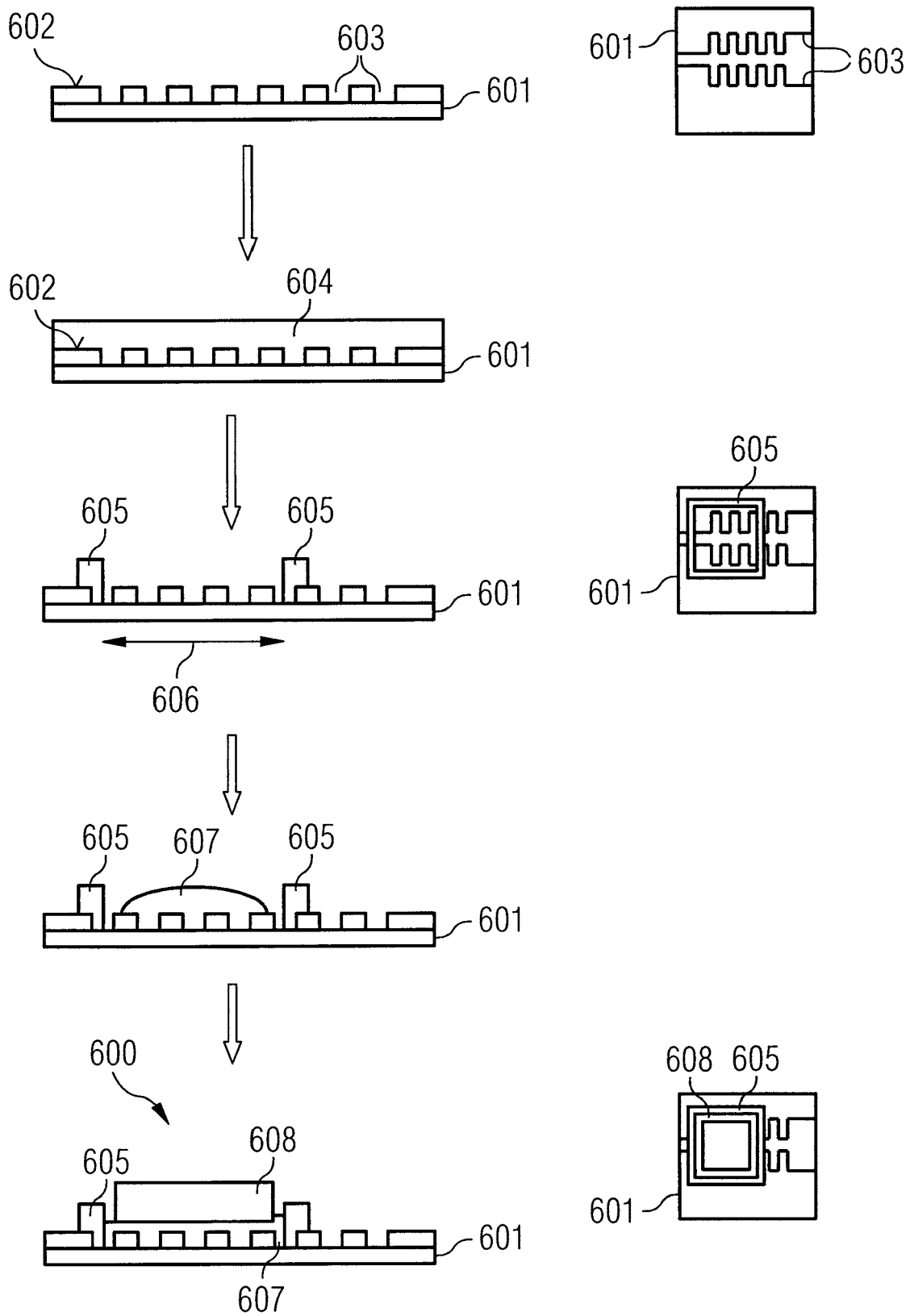
FIG. 6 illustrates schematic illustrations of a module 600 and of a method for producing the module 600.

FIG. 6 illustrates a module 600 and a method for producing the module 600 as further exemplary embodiments. The module 600 represents a development of the modules 300 and 400 illustrated in FIGS. 3 and 4. The configurations of the module 600 that are described below may therefore equally be applied to the modules 300 and 400.

In order to produce the module 600, firstly a first semiconductor chip 601 is provided, which is illustrated at the top in a cross-sectional view and a plan view in FIG. 6. The semiconductor chip 601 may be configured in exactly the same way as the semi-conductor chip 501 illustrated in FIG. 5. Accordingly, the semiconductor chip 601 may have depressions 603 on a main surface 602.

A resist layer 604 is applied to the main surface 602 and is subsequently patterned photolithographically in such a way that only a wall 605 composed of resist material remains on the main surface 602. The wall 605 bounds a region 606, onto which an electrically insulating and pasty adhesive material 607 is dispensed, which penetrates into the depressions 603 present in the region 606. A second semiconductor chip 608 is placed onto the adhesive material 607.

The semiconductor chips 601 and 608 are insulated from one another by the adhesive material 607. During the production of the module 600, care should be taken to ensure that enough adhesive material 607 is dispensed onto the region 606, such that the semiconductor chip 608 does not touch the main surface 602 of the semiconductor chip 601. The wall 605 prevents an uncontrolled propagation of the adhesive material 607 over the semiconductor chip 601. The semiconductor chip 601 is e.g., a power semiconductor controlled by the semiconductor chip 608 embodied as a logic device. The materials mentioned furtherabove may be used for the adhesive material 607.

Figure 7:
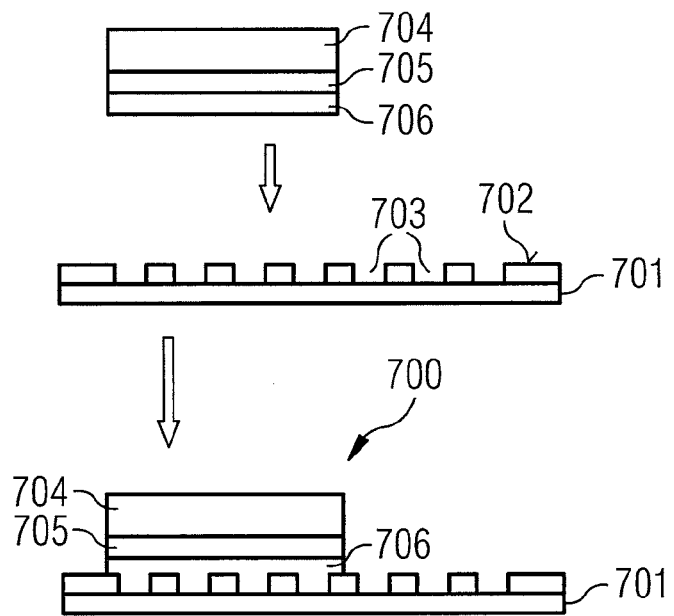
FIG. 7 illustrates schematic illustrations of a module 700 and of a method for producing the module 700.

FIG. 7 illustrates a module 700 and a method for producing the module 700 as further exemplary embodiments. The module 700 represents a development of the modules 100 and 200 illustrated in FIGS. 1 and 2. The configurations of the module 700 that are described below may therefore equally be applied to the modules 100 and 200.

In order to produce the module 700, a first semiconductor chip 701 is provided. The semiconductor chip 701 may be configured in exactly the same way as the semiconductor chip 501 illustrated in FIG. 5; accordingly, it may have depressions 703 on a main surface 702. Furthermore, a second semiconductor chip 704 is provided, to the underside of which two adhesive films 705 and 706 are applied. The semiconductor chip 704 is placed onto the semiconductor chip 701 by the adhesive films 705 and 706. During the adhesive-bonding process, which is carried out for example at a temperature within the range of 70° C. to 90° C., the lower adhesive film 706 is viscous and can thus penetrate into the depressions 703 on the main surface 702 of the semiconductor chip 701. During the entire adhesive-bonding process, the adhesive film 705 has a sufficient mechanical strength, such that it cannot be pressed into the depressions 703. This ensures a minimum distance between the two semiconductor chips 701 and 704. Since the two adhesive films 705 and 706 are electrically insulating, moreover, the arrangement illustrated in FIG. 7 effects an electrical insulation between the semiconductor chips 701 and 704, which may be designed e.g., as power semiconductor and logic device.

For the adhesive film 706 that is viscous during the adhesive-bonding process, it is possible to use for example filled or unfilled epoxy resins, polyimides, acrylate resins, silicone resins or mixtures of the materials mentioned. As materials for the adhesive film 705 that is comparatively rigid during he adhesive-bonding process, it is possible to use for example filled or unfilled polyimides, acrylate resins, silicone resins, polybenzoxazoles, epoxy resins or mixtures thereof.

Figure 8:
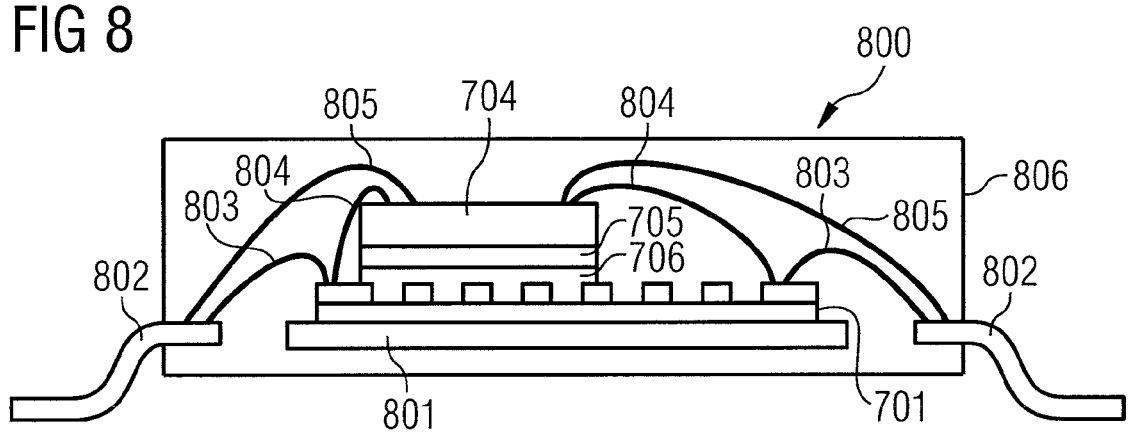
FIG. 8 illustrates a schematic illustration of a module 800.

External contact elements by using which electrical contact can be made with the modules 100 to 700 externally are not illustrated in FIGS. 1 to 7 for reasons of clarity. By way of example, FIG. 8 illustrates a module 800 with its external contact elements. The module 800 otherwise corresponds to the module 700. External contact elements may equally be added to the modules 100 to 600 in a corresponding manner.

In the module 800, the semiconductor chips 701 and 704 stacked one above another have been mounted onto a carrier 801 (die pad) of a leadframe. External contact elements 802 in the form of pins are arranged in grid form, for example, around the carrier 801. The semiconductor chip 704 has been mounted onto the semiconductor chip 701 in such a way that the contact areas of the semiconductor chip 701 are uncovered. The contact areas of the semiconductor chip 701 are connected to the external contact elements 802 by using bonding wires 803. The contact areas of the semiconductor chip 704 can be connected to the semiconductor chip 701 by using bonding wires 804 and/or directly to the external contact elements 802 by using bonding wires 805.

During the production of the module 800, the carrier 801 together with module 700 mounted thereon was enveloped with an encapsulating material 806. Only the external contact elements 802 project from the housing formed by the encapsulating material 806. By using the external contact elements 802, the module 800 can for example be applied to a printed circuit board and be soldered there.

Figure 9:
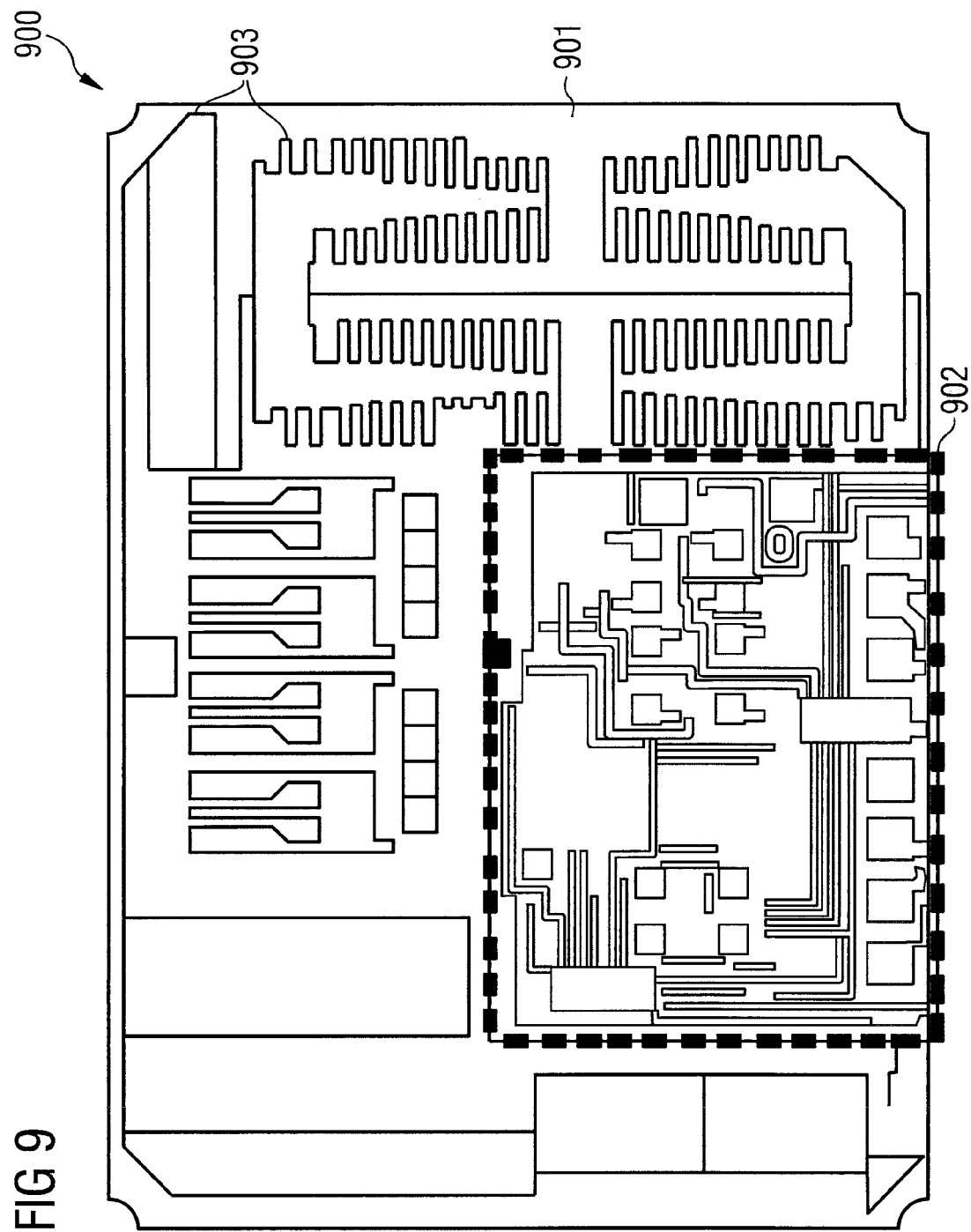
FIG. 9 illustrates a photograph of a module 900.

FIG. 9 illustrates a module 900 as a realization of the modules 100 to 700 in a plan view. A logic device 902 has been mounted onto a semiconductor chip 901. The semiconductor chip 901 has a metal layer on its top side, which metal layer has been patterned by using depressions 903.

By way of example, components based on different technologies, such as e.g., CMOS (Complementary Metal Oxide Semiconductor), bipolar or DMOS (Double-Diffused Metal Oxide Semiconductor or Diffusion Metal Oxide Semiconductor) technologies, can be integrated into the semiconductor chip 901. Consequently, the semiconductor chip 901 may contain e.g., CMOS logic circuits, bipolar switches and DMOS power transistors. The depressions 903, by which the metal layer at the top side of the semiconductor chip 901 is separated into regions that are insulated from one another, enable the operating potentials of the CMOS, bipolar and DMOS circuits in the substrate and at the surface to be insulated from one another with minimum space requirement. Furthermore, it is also possible, for example, for two DMOS power transistors to be electrically isolated from one another by the depressions 903. Depressions 903 having a comparable aspect ratio may also be used for other applications besides insulation purposes. The semiconductor chip 901 may be e.g., an SPT (Smart Power Technology) chip.

The meander structure of the depressions 903 that is present in the power region of the semiconductor chip 901 results in a lengthening of the trenches by which the source and drain regions of the power transistors integrated into the semiconductor chip 901 are separated from one another. This enables high currents to be switched.

On the surface of the semiconductor chip 901, some regions are covered with metal over a large area. By way of example, an adhesion promoter for an encapsulant that is to be applied later can be electrodeposited on these metal surfaces.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. A module comprising:
a first semiconductor chip, which has a depression within a first main surface;
a spacer, which is applied to the first main surface and at least partly fills the depression; and
a second semiconductor chip having a second main surface which is applied to the spacer, wherein the first main surface is a surface of a patterned and electrically conductive first layer, and wherein the first main surface and the second main surface are electrically insulated from one another.

2. The module of claim 1, wherein the spacer is electrically insulating.

3. The module of claim 1, wherein the first layer is a metal layer.

4. The module of claim 1, wherein the first main surface has a contact area that is not covered by the spacer.

5. The module of claim 1, wherein the spacer has a second layer composed of a resist material.

6. The module of claim 5, wherein the spacer furthermore has an adhesive material applied to the resist material.

7. The module of claim 5, wherein the spacer has a third layer, which at least partly fills the depression, and a fourth layer, which is applied to the third layer.

8. The module of claim 7, wherein the third layer and the fourth layer in each case contain an adhesive material.

9. The module of claim 7, wherein the fourth layer is arranged remote from the first main surface.

10. The module of claim 1, wherein a barrier structure is arranged on the first main surface.

11. The module of claim 10, wherein the spacer is an adhesive material that is applied to the first main surface and is delimited in its extent by the barrier structure.

12. The module of claim 10, wherein the barrier structure has at least one wall and the at least one wall is fabricated in particular from a resist material.

13. The module of claim 1, wherein the second semiconductor chip has a first main surface opposite the second main surface, wherein the first main surface of the second semiconductor chip is an active surface and faces away from the first semiconductor chip.

14. A module comprising:
a first semiconductor chip, having a depression within a first main surface;
an adhesive material applied to the first main surface;
a delimiting structure on the first main surface that delimits the adhesive material; and
a second semiconductor chip having a second main surface which is applied to the adhesive material, wherein the first main surface and second main surface are electrically insulated from one another.

15. The module of claim 14, wherein the adhesive material adjoins the delimiting structure.

16. The module of claim 14, wherein the first semiconductor chip and the second semiconductor chip are electrically insulated from one another.

17. The module of claim 14, wherein the first main surface is a surface of a patterned and electrically conductive first layer.

18. The module of claim 17, wherein the first layer is a metal layer.

19. The module of claim 17, wherein the delimiting structure is a second layer composed of a resist material, which second layer covers the first region.

20. The module of claim 19, wherein the adhesive material is applied to the second layer.

21. The module of claim 14, wherein at least one contact area is arranged outside the first region on the first main surface.

22. The module of claim 14, wherein the delimiting structure is a barrier structure.

23. The module of claim 22, wherein the adhesive material is delimited in its extent by the barrier structure.

24. The module of claim 22, wherein the barrier structure has at least one wall and the at least one wall is fabricated in particular from a resist material.

25. A module comprising:
 a first semiconductor chip having a depression within a first main surface, wherein the first main surface is a surface of a patterned and electrically conductive first layer;
 a delimiting structure that delimits a first region of the first main surface, wherein the delimiting structure includes a second layer composed of a resist material, which second layer covers the first region, and includes a third layer composed of an adhesive material, which third layer covers the first region; and
 a second semiconductor chip having a second main surface which is applied to the adhesive material, wherein the first main surface and second main surface are electrically insulated from one another.

26. A module comprising:
 a first semiconductor chip having a first main surface;
 a barrier structure having a lower surface applied to the first main surface and an opposing upper surface defining a border;
 an adhesive material applied to the first main surface, which adhesive material is delimited in its extent by the barrier structure; and
 a second semiconductor chip having a lower main surface applied to the adhesive material, wherein the lower main surface of the second semiconductor chip is arranged within the border defined by the barrier structure and is below the upper surface of the barrier structure.

27. A method comprising:
 providing a first semiconductor chip, which has a depression within a first main surface, wherein the first main surface is a surface of a patterned and electrically conductive first layer;
 filling the depression at least partly with a filling material; and
 applying a second main surface of a second semiconductor chip to the filling material, wherein the first main surface and the second main surface are electrically insulated from one another.

28. The method of claim 27, wherein the filling material is a resist material.

29. The method of claim 28, wherein the resist material is patterned.

30. The method of claim 28, wherein an adhesive material is applied to the resist material.

31. The method of claim 27, wherein a barrier structure is applied to the first main surface.

32. The method of claim 31, wherein the filling material is an adhesive material that is applied to the first main surface and is delimited in its extent by the barrier structure.

33. The method of claim 27, wherein the filling material is a first adhesive film, which is applied to the first main surface and is viscous or liquid in the meantime.

34. The method of claim 33, wherein the first adhesive film is applied to the first main surface together with a second adhesive film, which is arranged on the first adhesive film, and the second semiconductor chip, which is arranged on the second adhesive film.

35. A method comprising:
 providing a first semiconductor chip, which has a depression within a first main surface;
 applying a delimiting structure to the first main surface;
 applying an adhesive material to the first main surface, the adhesive material delimited by the delimiting structure; and
 applying a second main surface of a second semiconductor chip to the adhesive material, wherein the first main surface and second main surface are electrically isolated from one another.

36. The method of claim 35, wherein the delimiting structure is a resist material covering the first region.

37. The method of claim 36, wherein the adhesive material is applied to the resist material.

38. The method of claim 35, wherein the delimiting structure is a barrier structure.

39. The method of claim 38, wherein the adhesive material is delimited in its extent by the barrier structure.

40. A method comprising:
 a first semiconductor chip having a depression within a main surface is provided;
 attaching a first adhesive film and a second adhesive film on a bottom side of a second semiconductor chip;
 mounting the bottom side of the second semiconductor chip, via the first and second adhesive films, onto the main surface of the first semiconductor chip, wherein the second adhesive film is configured to intrude into the depression and the first adhesive film is configured having a mechanical strength such that the first adhesive film does not intrude into the depression.

\* \* \* \* \*